(12) United States Patent
Jeong

(10) Patent No.: US 11,418,748 B2
(45) Date of Patent: Aug. 16, 2022

(54) IMAGE SENSOR

(71) Applicant: SK hynix Inc., Gyeonggi-do (KR)

(72) Inventor: Hoe Sam Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 325 days.

(21) Appl. No.: 16/657,671

(22) Filed: Oct. 18, 2019

(65) Prior Publication Data

US 2020/0366861 A1 Nov. 19, 2020

(30) Foreign Application Priority Data

May 13, 2019 (KR) .................. 10-2019-0055725

(51) Int. Cl.
| | |
|---|---|
| *H04N 5/376* | (2011.01) |
| *H03M 1/56* | (2006.01) |
| *H04N 5/378* | (2011.01) |
| *H04N 5/3745* | (2011.01) |

(52) U.S. Cl.
CPC ............ *H04N 5/3765* (2013.01); *H03M 1/56* (2013.01); *H04N 5/378* (2013.01); *H04N 5/3745* (2013.01)

(58) Field of Classification Search
CPC ....... H03M 1/56; H04N 5/3765; H04N 5/378; H04N 5/3745
See application file for complete search history.

(56) References Cited

U.S. PATENT DOCUMENTS

| | | | |
|---|---|---|---|
| 7,629,913 B2 | 12/2009 | Okumura | |
| 9,681,082 B2 | 6/2017 | Lee | |
| 11,293,954 B2 * | 4/2022 | Gupta | .............. G01R 19/16523 |
| 2011/0140741 A1 * | 6/2011 | Zerbe | .................. G06F 13/1678 |
| | | | 327/57 |
| 2020/0082853 A1 * | 3/2020 | Shin | .................. H01L 27/14603 |

* cited by examiner

*Primary Examiner* — Antoinette T Spinks
(74) *Attorney, Agent, or Firm* — IP & T Group LLP

(57) ABSTRACT

An image sensor for stably generating pulses of a precharge signal is disclosed. The image sensor includes a divider configured to generate a plurality of divided clock signals by dividing one or ore input clock signal, a precharge pulse generator configured to generate a first pulse signal by selecting any one of the plurality of divided clock signals in response to decoding signals of a first group, and generate a second pulse signal by selecting any one of the plurality of divided clock signals in response to decoding signals of a second group, and a precharge signal generator configured to generate a precharge signal by combining the first pulse signal and the second pulse signal.

20 Claims, 15 Drawing Sheets

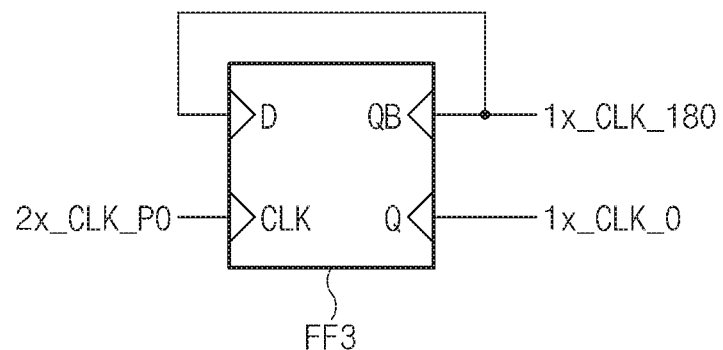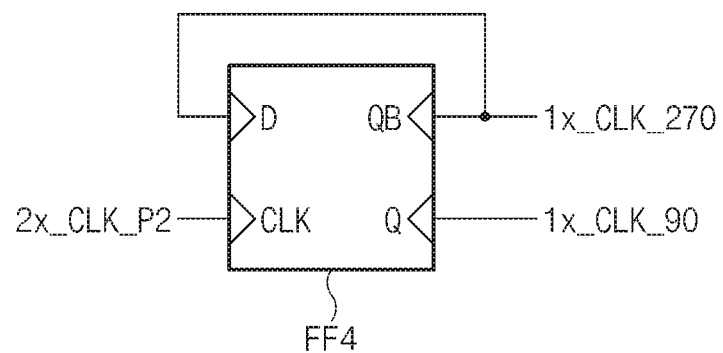
FIG. 8

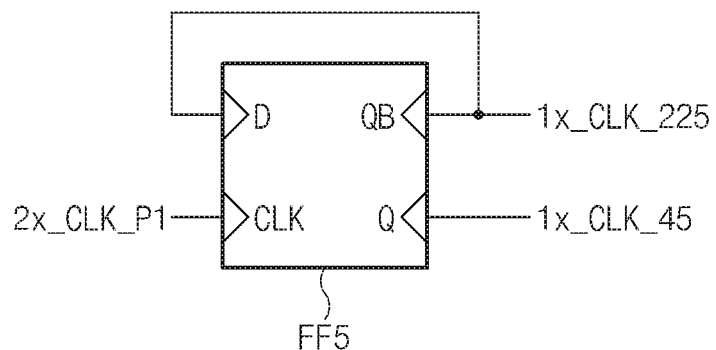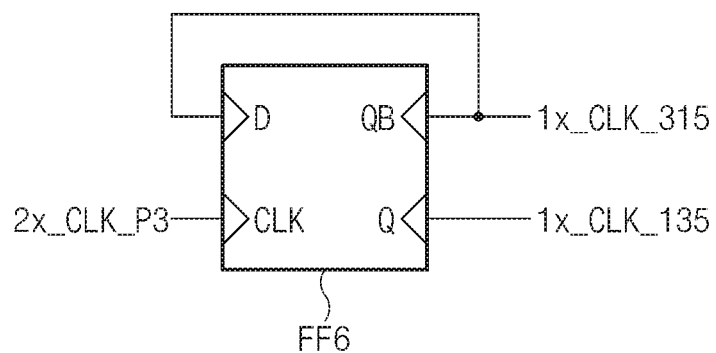
FIG.9

IMAGE SENSOR

CROSS-REFERENCE TO RELATED APPLICATION

This patent document claims priority based upon Korean patent application No. 10-2019-0055725, filed on May 13, 2019, the disclosure of which is herein incorporated by reference in its entirety.

TECHNICAL FIELD

Embodiments of the disclosed technology generally relate to an image sensor, and more particularly to a technology for stably generating pulses of a precharge signal.

BACKGROUND

Generally, a Complementary Metal Oxide Semiconductor (CMOS) Image Sensor (CIS) implemented by a CMOS process has been developed to have lower power consumption, lower costs, and smaller sizes than other competitive products. Thus, CMOS image sensors (CISs) have been intensively researched and have rapidly come into widespread use. Specifically, CMOS image sensors (CISs) have been developed to have higher image quality than other competitive products, such that the application scope of CMOS image sensors (CISs) has recently been extended to video applications that require higher resolution and higher frame rate as compared to competitive products.

Differently from a solid state image pickup device, it is necessary for the CMOS image sensor (CIS) to convert analog signals (pixel signals) generated from a pixel array into digital signals. In order to convert analog signals into digital signals, the CMOS image sensor (CIS) has been designed to include a high-resolution Analog-to-Digital Converter (ADC).

The analog-to-digital converter (ADC) may perform correlated double sampling about an analog output voltage indicating an output signal of the pixel array, and may store the resultant voltage in one or more line memories. In addition, a sense amplifier may sense and amplify the digital signal readout from the line memory through a column line to generate an amplified digital signal.

SUMMARY

Various embodiments of the disclosed technology are directed to providing an image sensor that substantially addresses one or more issues due to limitations and disadvantages of the related art.

Embodiments of the disclosed technology relate to an image sensor for stably performing a precharge operation by generating a precharge pulse having a predetermined width.

In accordance with an embodiment of the disclosed technology, an image sensor includes a divider configured to generate a plurality of divided clock signals by dividing one or more input clock signal, a precharge pulse generator configured to generate a first pulse signal by selecting any one of the plurality of divided clock signals in response to decoding signals of a first group, and generate a second pulse signal by selecting any one of the plurality of divided clock signals in response to decoding signals of a second group, and a precharge signal generator configured to generate a precharge signal by combining the first pulse signal and the second pulse signal.

In accordance with another embodiment of the disclosed technology, an image sensor includes a line memory configured to latch a digital signal corresponding to a pixel signal, and output the latched digital signal to a pair of bit lines in response to an output control signal, a sense amplifier configured to amplify a voltage of the pair of bit lines in response to a sensing enable signal, a precharge circuit configured to precharge the pair of bit lines in response to a precharge signal, and a precharge controller configured to generate a plurality of divided clock signals by dividing an input clock signal, generate a first pulse signal and a second pulse signal in response to a divided clock signal selected from among the plurality of divided clock signals according to decoding signals, and generate the precharge signal by combining the first pulse signal and the second pulse signal.

It is to be understood that both the foregoing general description and the following detailed description of the disclosed technology are illustrative and explanatory and are intended to provide further description of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

FIGS. 8 and 9 are schematic diagrams illustrating examples of the clock divider shown in FIG. 5 in accordance with an embodiment of the disclosed technology.

DETAILED DESCRIPTION

Reference will now be made in detail to embodiments of the disclosed technology, examples of which are illustrated in the accompanying drawings. Wherever possible, the same reference numbers are used throughout the drawings to refer to the same or like portions. Throughout the specification of the disclosed technology, if a certain part is connected (or coupled) to another part, the term "connection or coupling" means that the certain part is connected (or coupled) to another part and/or is electrically connected (or coupled) to another part through the medium of a third part. Throughout the specification of the disclosed technology, if a certain part includes a certain component, the term "comprising or including" means that a corresponding component may further include other components unless specifically stated otherwise. As used in the specification and appended claims, the terms "a", "an", "one", "the" and other similar terms include both singular and plural forms, unless the context clearly dictates otherwise. The terms used in the present application are merely used to describe specific embodiments and are not intended to limit the disclosed technology. A singular expression may include a plural expression unless stated otherwise.

Figure 1:
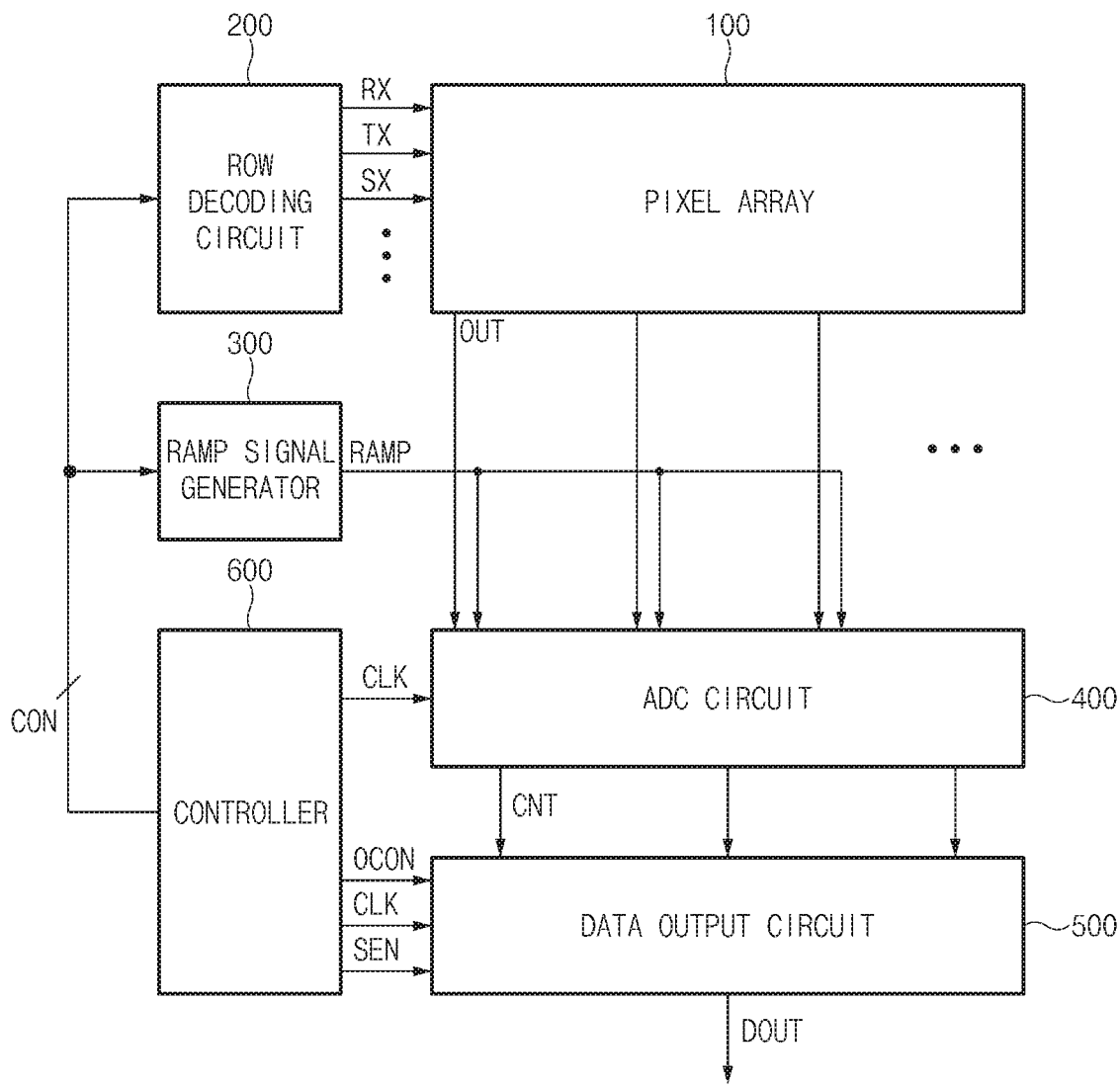
FIG. 1 is a block diagram illustrating an image sensor in accordance with an embodiment of the disclosed technology.

FIG. 1 is a block diagram illustrating an image sensor in accordance with an embodiment of the disclosed technology.

Referring to FIG. 1, the image sensor 10 in accordance with the embodiment of the disclosed technology may include a pixel array 100, a row decoding circuit 200, a ramp signal generator 300, an analog-to-digital converter (ADC) circuit 400, a data output circuit 500, and a controller 600.

The pixel array 100 may convert an incident light signal into an electrical signal, and may output an analog pixel signal OUT to the ADC circuit 400. In this case, the pixel array 100 may be driven by various drive signals, for example, a reset signal RX, a transmission signal TX, a selection signal SX, etc. that are received from the row decoding circuit 200.

The row decoding circuit 200 may select a row line of the pixel array 100. The row decoding circuit 200 may select at least one pixel for each row line from among pixels contained in the pixel array 100 according to individual row lines in response to a control signal CON received from the controller 600, and may control operations of the selected pixel.

The ramp signal generator 300 may generate a ramp signal RAMP in response to the control signal CON received from the controller 600, and may output the ramp signal RAMP to the ADC circuit 400.

The ADC circuit 400 may convert an analog pixel signal OUT received from the pixel array 100 into a digital signal. The ADC circuit 400 may compare the pixel signal OUT received from the pixel array 100 with the ramp signal RAMP received from the ramp signal generator 300, and may output a result of comparison between the pixel signal OUT and the ramp signal RAMP. The ADC circuit 400 may count the number of reference clock signals CLK received from the controller 600 in response to the result of comparison between the pixel signal OUT and the ramp signal RAMP, and may output a column-based counting signal CNT.

The data output circuit 500 may latch or hold the digital signal CNT received from the ADC circuit 400. The data output circuit 500 may latch or hold counting information (i.e., the digital signal CNT), and may sequentially output pixel data DOUT in response to an output control signal OCON and a reference clock signal CLK.

The data output circuit 500 may stably precharge a voltage of a sense amplifier (to be described later) in a precharge period. For this purpose, the data output circuit 500 may receive an output control signal OCON, a reference clock signal CLK, and a sensing enable signal SEN from the controller 600.

The controller 600 may control the row decoding circuit 200, the ramp signal generator 300, the ADC circuit 400, and the data output circuit 500. In this case, the controller 600 may include a timing generator. That is, the controller 600 may control the overall procedure ranging from a process of sensing image data to a process of outputting the sensed image data according to lapse of time.

For this purpose, the controller 600 may generate a control signal CON, and may output the control signal CON to the row decoding circuit 200 and the ramp signal generator 300. The controller 600 may generate a reference clock signal CLK, and may output the reference clock signal CLK to the ADC circuit 400. In addition, the controller 600 may generate an output control signal OCON, a reference clock signal CLK, and a sensing enable signal SEN, and may output the output control signal OCON, the reference clock signal CLK, and the sensing enable signal SEN to the data output circuit 500.

Figure 2:
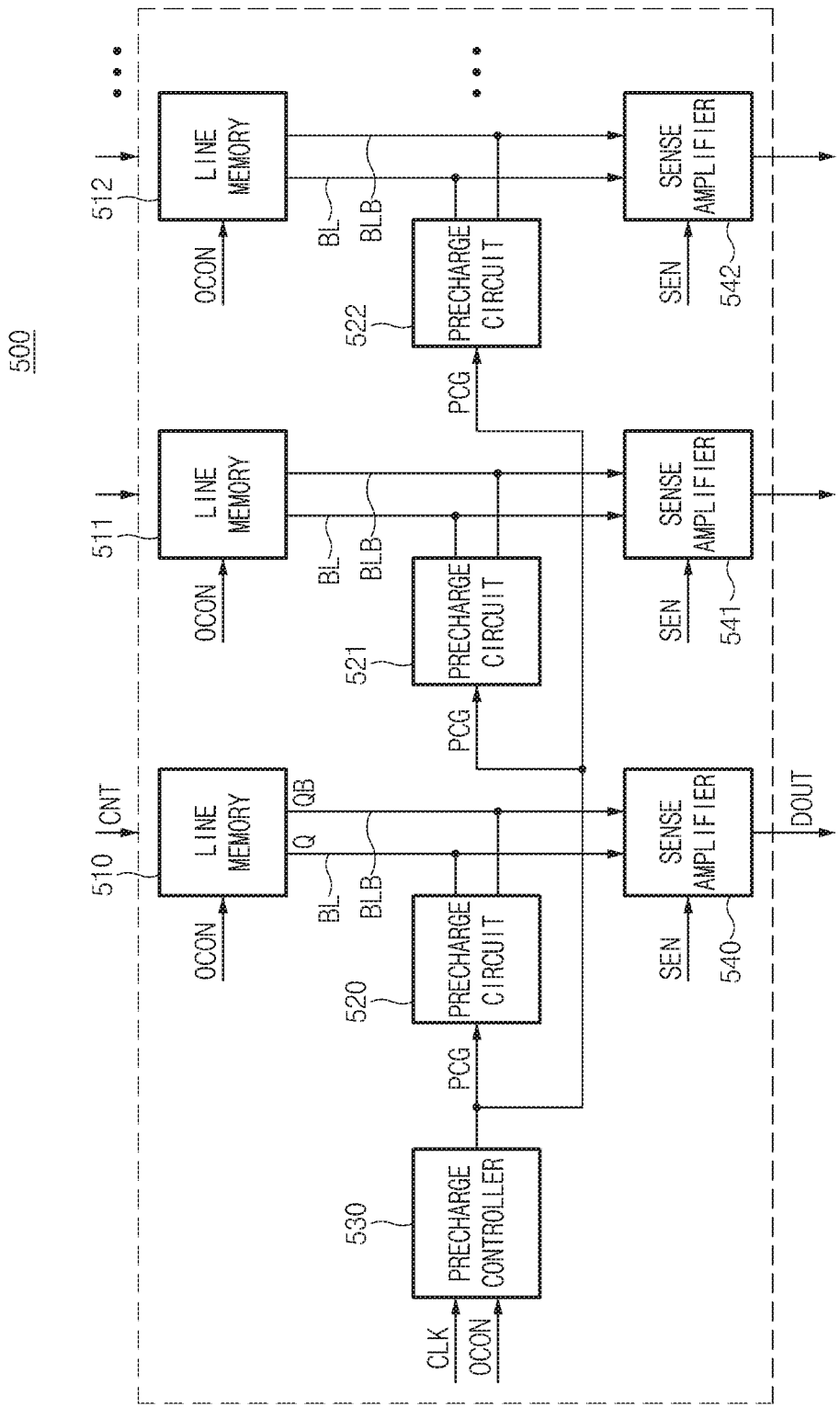
FIG. 2 is a detailed schematic diagram illustrating a data output circuit shown in FIG. 1 in accordance with an embodiment of the disclosed technology.

FIG. 2 is a detailed schematic diagram illustrating the data output circuit 500 shown in FIG. 1.

Referring to FIG. 2, the data output circuit 500 may include a plurality of line memories 510 to 512, a plurality of precharge circuits 520 to 522, a precharge controller 530, and a plurality of sense amplifiers 540 to 542.

In this case, the plurality of line memories 510 to 512 may receive a digital signal CNT from the ADC circuit 400, and may store the digital signal CNT for each line. The line memory 510 may be coupled to the sense amplifier 540 through a pair of column lines (hereinafter referred to as a pair of bit lines) BL and BLB. The line memory 511 may be coupled to the sense amplifier 541 through a pair of column lines (hereinafter referred to as a pair of bit lines) BL and BLB. The line memory 512 may be coupled to the sense amplifier 542 through a pair of column lines (hereinafter referred to as a pair of bit lines) BL and BLB. The line memory 510 may output a pair of data signals Q and QB to a pair of bit lines BL and BLB. The line memory 511 may output a pair of data signals Q and QB to a pair of bit lines BL and BLB. The line memory 512 may output a pair of data signals Q and QB to a pair of column lines BL and BLB.

Although each of the line memories 510 to 512 can be implemented as a Static Random Access Memory (SRAM) for convenience of description, the scope or spirit of the disclosed technology is not limited thereto.

In accordance with an embodiment, although the pair of data signals Q and QB output from each of the line memories 510 to 512 is complementary to data, the pair of data signals Q and QB will hereinafter be referred to as a data pair Q and QB in the remaining cases other than a specific requisite case for convenience of description.

Each of the line memories 510 to 512 may charge or discharge the pair of bit lines BL and BLB in response to the output control signal OCON within a time duration t3 after the precharge of the pair of bit lines BL and BLB within a time duration t2, which will be described later with reference to FIG. 3.

For example, the line memory 510 may amplify a charge value of one bit line BL from among the pair of bit lines BL and BLB, and may reduce a charge value of the other bit line (i.e., a bit line bar) BLB from among the pair of bit lines BL and BLB. Therefore, the plurality of line memories 510 to 512 may transmit the amplified charge value to a differential input terminal of each of the sense amplifiers 540 to 542.

The plurality of precharge circuits 520 to 522 may precharge each of the bit lines BL and BLB with a precharge voltage level in response to the precharge signal PCG within the time duration t2. The precharge circuit 520 may precharge the pair of bit lines BL and BLB before the pair of data signals Q and QB is transmitted to the sense amplifier 540. The precharge circuit 521 may precharge the pair of bit lines BL and BLB before the pair of data signals Q and QB is transmitted to the sense amplifier 541. The precharge circuit 522 may precharge the pair of bit lines BL and BLB before the pair of data signals Q and QB is transmitted to the sense amplifier 542. That is, the plurality of precharge circuits 520 to 522 may precharge the pair of bit lines BL and BLB before the pair of two data Q and QB is transmitted to the sense amplifiers 540 to 542. In accordance with an embodiment, the precharge voltage level applied to each of the bit lines BL and BLB may be set to a voltage level denoted by "VDD/2" (where VDD is a power-supply voltage).

The number of the precharge circuits 520 to 522 may be identical to the number of line memories 510 to 512. However, the scope or spirit of the disclosed technology is not limited thereto, and the number of the precharge circuits 520 to 522 and the positions of the precharge circuits 520 to 522 may be changed in various ways. Each of the plurality of precharge circuits 520 to 522 may include a plurality of switching elements (not shown), each of which is driven in response to the precharge signal PCG.

In addition, the precharge controller 530 may generate the precharge signal PCG in response to the reference clock signal CLK and the output control signal OCON, and may output the generated precharge signal PCG to the precharge circuits 520 to 522. In accordance with an embodiment, the precharge signal PCG may be activated earlier than the sensing enable signal SEN, as described later with reference to FIG. 3.

Each of the sense amplifiers 540 to 542 may perform a sensing operation in response to the sensing enable signal SEN. The sense amplifier 540 may detect a voltage difference between bit lines BL and BLB, may amplify the detected voltage difference, and may thus output pixel data DOUT. The sense amplifier 541 may detect a voltage difference between bit lines BL and BLB, may amplify the detected voltage difference, and may thus output pixel data DOUT. The sense amplifier 542 may detect a voltage difference between bit lines BL and BLB, may amplify the detected voltage difference, and may thus output pixel data DOUT.

Operations of the data output circuit 500 having the above-mentioned constituent elements will hereinafter be described with reference to FIG. 3. Data readout operations of individual columns are identical to each other as shown in FIG. 2, such that the data readout operation of only one column from among the plurality of columns will hereinafter be described for convenience of description.

Figure 3:
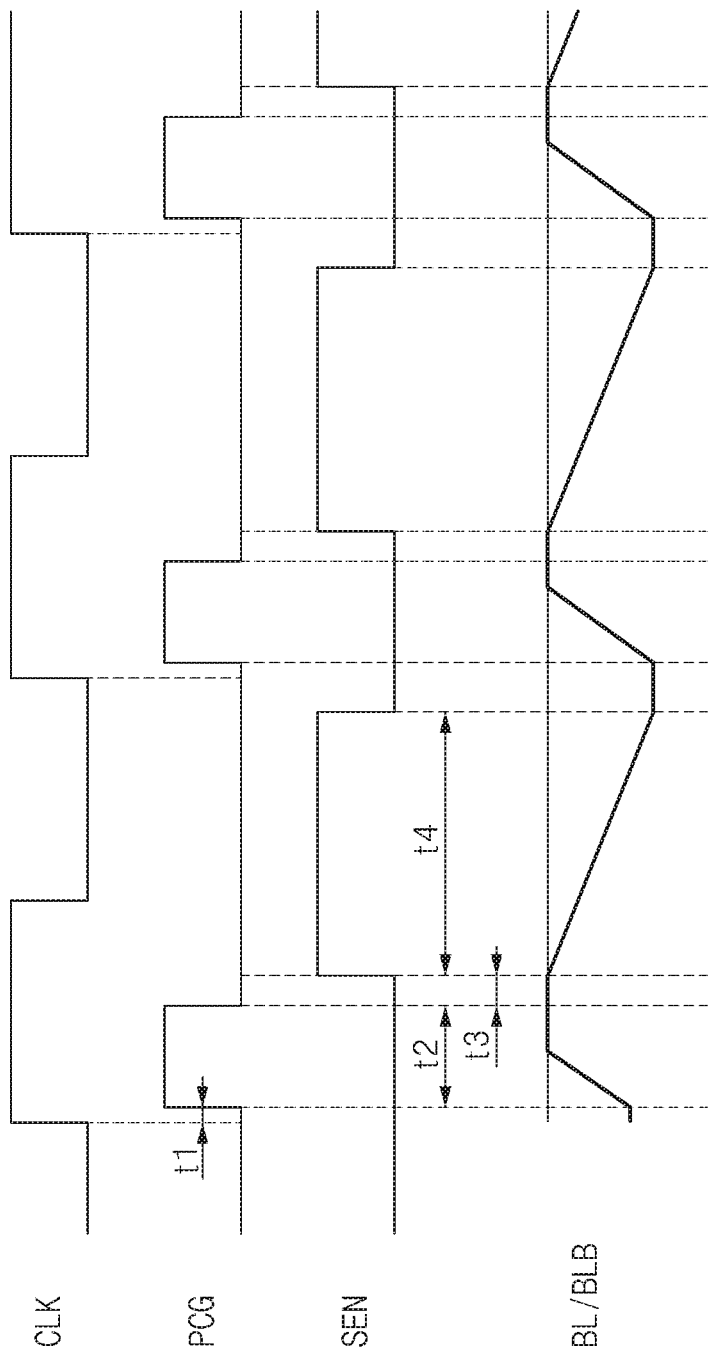
FIG. 3 is a waveform diagram illustrating operations of a sense amplifier shown in FIG. 2 in accordance with an embodiment of the disclosed technology.

Referring to FIG. 3, the precharge circuit 520 may precharge the pair of bit lines (i.e., bit line pair) BL and BLB with a precharge voltage level (e.g., VDD/2) in response to the precharge signal PCG during the precharge section "t2". When the reference clock signal CLK is enabled, the precharge signal PCG may be activated after lapse of a predetermined amount of time 't1'. Thus, during a PCG activation time (i.e., during the precharge section 't2') within one cycle of the reference clock signal CLK, the precharge operation may be carried out.

Subsequently, the line memory 510 may latch or hold the digital signal CNT received from the ADC circuit 400. The line memory 510 may output the pair of data signals Q and QB to the pair of bit lines BL and BLB in response to the output control signal OCON. The data signals (i.e., the data pair) Q and QB respectively applied to the bit lines BL and BLB may be transmitted to the sense amplifier 540.

As described above, when the output control signal OCON is activated, the line memory 510 may allow each of the bit lines BL and BLB to be charged or discharged within the time duration t3. That is, one bit line BL from among two bit lines BL and BLB may increase a voltage through the charging operation, and the other bit line BLB from among the two bit lines BL and BLB may reduce a voltage through the discharging operation.

For example, within the time duration t3, the data signal Q received through the bit line BL may be charged with the power-supply voltage level at a precharge voltage level. The other data signal QB received through the bit line bar BLB may be discharged with a ground voltage level at a predetermined voltage level.

That is, the line memory 510 may be configured to control the pair of bit lines BL and BLB to be charged or discharged in a complementary manner. As a result, it is possible to prevent differential input values of the sense amplifier 540 from leaning to one level in a manner that the differential input values of the sense amplifier 540 can be kept at the central voltage without being reduced or increased.

Subsequently, within the time duration t4, when the sensing enable signal SEN is activated, the sense amplifier 540 may perform the sensing operation. That is, after lapse of a predetermined time 't3' from a specific time at which the precharge signal PCG is disabled, the sensing enable signal SEN may be activated. As a result, the sense amplifier 540 may perform the sensing operation during a predetermined time 't4' in which the sensing enable signal SEN is activated within one cycle of the reference clock signal CLK.

During the sensing operation, the sense amplifier 540 may detect a voltage difference between data signals (i.e., the data pair) Q and QB, may amplify the detected voltage difference, and may thus output pixel data DOUT. Here, the higher the voltage difference between the data signals Q and QB, the higher the sensing margin of the sense amplifier 540.

However, a pulse width of the precharge signal PCG may be changed according to the PVT (Process, Voltage, Temperature) conditions within the precharge section. For example, the pulse width of the precharge signal may be shortened according to the PVT conditions within the precharge section. In contrast, the pulse width of the precharge signal PCG may be elongated at a low-voltage condition. In this way, when the precharge time is short or long, it may be difficult to guarantee the sensing margin of the sense amplifier 540, and detection performance of the sense amplifier 540 may also be affected.

Therefore, the embodiment of the disclosed technology may generate divided clock signals having several phases from an input clock signal. The embodiment of the disclosed technology may select a specific clock signal (e.g., two clocks) from among the divided clock signals having several phases according to a precharge pulse-width control signal corresponding to the PVT condition. The embodiment of the disclosed technology may generate a clock-based precharge signal PCT by combining the selected clock signals. Therefore, the embodiment of the disclosed technology may constantly generate pulses of the precharge signal irrespective of the PVT condition. Thus, the embodiment of the disclosed technology may stably perform the precharge operation.

Figure 4:
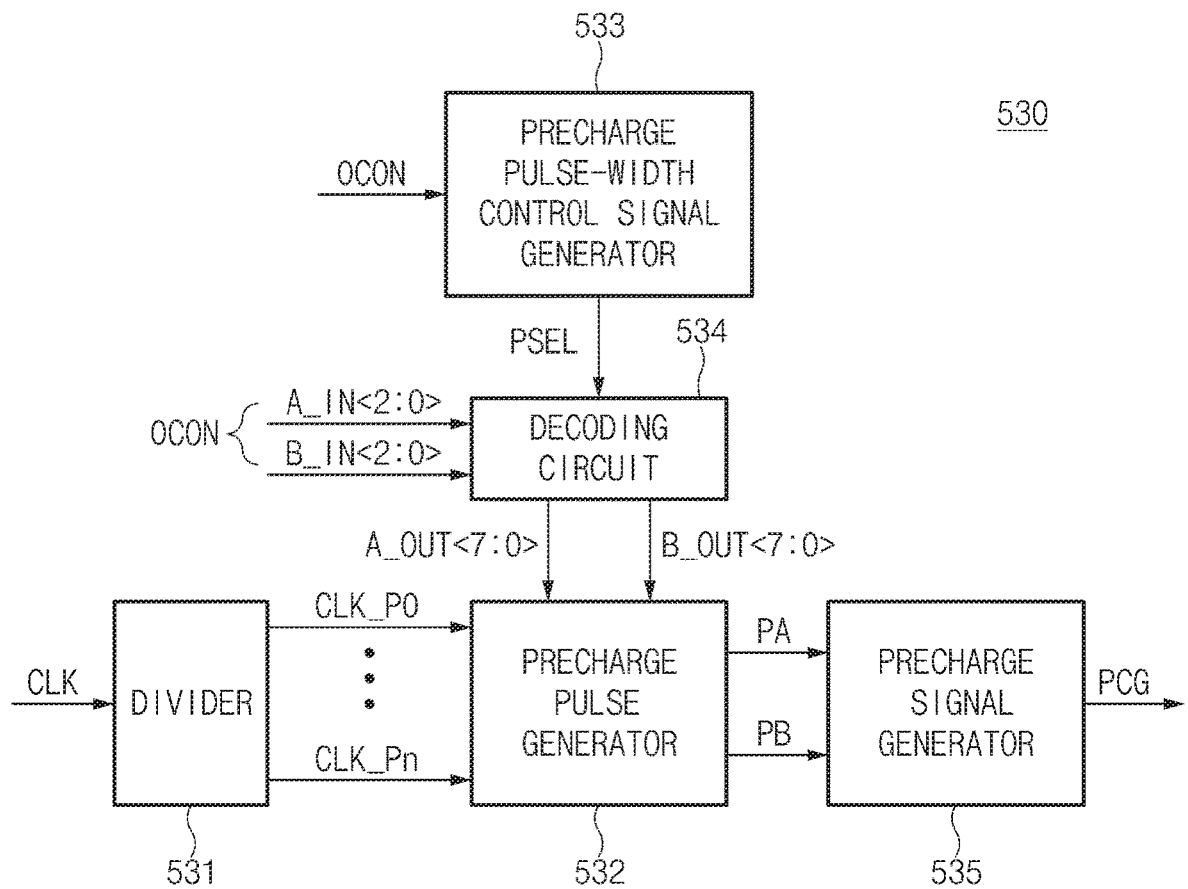
FIG. 4 is a detailed schematic diagram illustrating a precharge controller shown in FIG. 2 in accordance with an embodiment of the disclosed technology.

FIG. 4 is a detailed schematic diagram illustrating the precharge controller 530 shown in FIG. 2.

Referring to FIG. 4, the precharge controller 530 may generate the precharge signal PCG by dividing the reference clock signal CLK, and may control pulses of the precharge signal PCG in response to the output control signal ° CON. The precharge controller 530 may include a divider 531, a precharge pulse generator 532, a precharge pulse-width control signal generator 533, a decoding circuit 534, and a precharge signal generator 535.

In this case, the divider 531 may generate a plurality of divided clock signals CLK_P0 to CLK_Pn based on the reference clock signal CLK. For convenience of description and better understanding of the disclosed technology, the divider 531 in accordance with the embodiment of the disclosed technology may generate 8 divided clock signals CLK_P0 to CLK_P7 by dividing an input clock signal 4x_CLK (see FIG. 5) having a higher frequency than the reference clock signal CLK.

The precharge pulse generator 532 may generate a pulse signal PA in response to a plurality of decoding signals A_OUT<7:0>. The precharge pulse generator 532 may output any one of the plurality of divided clock signals CLK_P0 to CLK_P7 as the pulse signal PA in response to one decoding signal selected from among the plurality of decoding signals A_OUT<7:0>.

The precharge pulse generator 532 may generate the pulse signal PB in response to the plurality of decoding signals B_OUT<7:0>. The precharge pulse generator 532 may output one decoding signal selected from among the plurality of divided clock signals CLK_P0 to CLK_P7 as the pulse signal PB in response to one decoding signal selected from among the plurality of decoding signals B_OUT<7:0>.

The precharge pulse-width control signal generator 533 may generate a precharge pulse-width control signal PSEL in response to the output control signal OCON. The precharge pulse-width control signal generator 533 may generate the precharge pulse-width control signal PSEL for controlling the pulse width of the precharge signal PCG according to the PVT (Process, Voltage, Temperature) conditions.

The decoding circuit 534 may generate a plurality of decoding signals A_OUT<7:0> by decoding selection control signals A_IN<2:0>. The decoding circuit 534 may generate a plurality of decoding signals B_OUT<7:0> by decoding selection control signals B_IN<2:0>. In this case, the selection control signals A_IN<2:0> and B_IN<2:0> may be generated by the output control signal OCON.

The decoding circuit 534 may activate only one of the decoding signals A_OUT<7:0> in response to the precharge pulse-width control signal PSEL received from the precharge pulse-width control signal generator 533. In addition, the decoding circuit 534 may activate only one of the decoding signals B_OUT<7:0> in response to the precharge pulse-width control signal PSEL received from the precharge pulse-width control signal generator 533.

The precharge signal generator 535 may combine the pulse signals PA and PB, and may generate the precharge signal PCG in which a pulse width and a phase are controlled according to the result of combination of the pulse signals PA and PB. The precharge signal generator 535 may combine one pulse signal PA selected from among the plurality of divided clock signals CLK_P0 to CLK_P7 with the other (or same) pulse signal PB, and may thus generate the precharge signal PCG according to the result of the combination.

Although the embodiment of the disclosed technology has exemplarily disclosed that the number of divided clock signals CLK_P0 to CLK_P7 is set to 8, the number of decoding signals is set to 8, and the number of selection control signals A_IN<2:0> is set to 3 for convenience of description, the scope or spirit of the disclosed technology is not limited thereto, and it should be noted that the number of divided clock signals, the number of decoding signals, and the number of selection control signals may also be changed as necessary.

Figure 5:
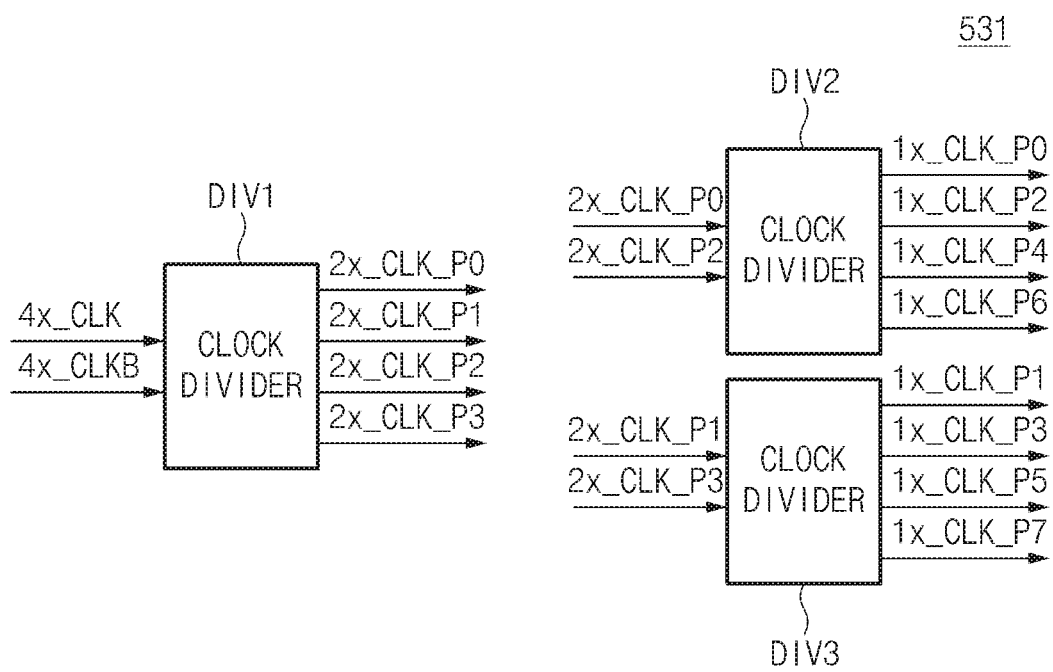
FIG. 5 is a detailed schematic diagram illustrating a divider shown in FIG. 4 in accordance with an embodiment of the disclosed technology.

FIG. 5 is a detailed schematic diagram illustrating the divider 531 shown in FIG. 4.

Referring to FIG. 5, the divider 531 may include a plurality of clock dividers DIV1 to DIV3.

The clock divider DIV1 may generate divided clock signals 2x_CLK_P0 to 2x_CLK_P3 by dividing input clock signals 4x_CLK and 4x_CLKB. The clock divider DIV1 may divide two input clock signals 4x_CLK and 4x_CLKB by two times, and may thus generate four divided clock signals 2x_CLK_P0 to 2x_CLK_P3.

The clock divider DIV2 may divide the divided clock signals 2x_CLK_P0 and 2x_CLK_P2, and may thus generate divided clock signals 1x_CLK_P0, 1x_CLK_P2, 1x_CLK_P4 and 1x_CLK_P6, The clock divider DIV2 may divide two divided clock signals 2x_CLK_P0 and 2x_CLK_P2 by two times, and may thus generate four divided clock signals 1x_CLK_P0, 1xx_CLK_P2, 1x_CLK_P4, 1x_CLK_P6.

The clock divider DIV3 may divide the divided clock signals 2x_CLK_P1 and 2x_CLK_P3, and may thus generate divided clock signals 1x_CLK_P1, 1x_CLK_P3, 1x_CLK_P5, and 1x_CLK_P7. The clock divider DIV3 may divide two divided clock signals 2x_CLK_P1 and 2x_CLK_P3 by two times, and may thus generate four divided clock signals 1x_CLK_P1, 1x_CLK_P3, 1x_CLK_P5, and 1x_CLK_P7.

For example, the clock dividers DIV2 and DIV3 may generate divided clock signals 1x_CLK_P0 to 1x_CLK_P7 having a predetermined phase interval therebetween. The clock dividers DIV2 and DIV3 may divide 360 degrees into 8 phases such that 8 divided clock signals 1x_CLK_P0 to 1x_CLK_P7 having a predetermined phase interval (i.e., a phase interval of 45 degrees) therebetween.

In this case, the reference clock signal CLK may have a preset period. Each of the input clock signals 4x_CLK and 4x_CLKB applied to the clock divider DIV1 may refer to a clock signal, a frequency of which is four times greater than that of the reference clock signal CLK. The input clock signal 4x_CLKB may be opposite in phase to the other input clock 4x_CLK.

Each of the divided clock signals 2x_CLK_P0 to 2x_CLK_P3 generated from the clock divider DIV1 may refer to a clock signal, a period of which is two times faster than that of the reference clock signal CLK. The divided clock signals 1x_CLK_P0 to 1x_CLK_P7 generated from the clock dividers DIV2 and DIV3 may refer to a clock signal that has the same frequency as the reference clock signal CLK.

The embodiment of the disclosed technology has exemplarily disclosed that the divider 531 receives four-times-faster input clock signals 4x_CLK and 4x_CLKB and divides each of the received four-times-faster input clock signals 4x_CLK and 4x_CLKB. The embodiment of the disclosed technology has exemplarily disclosed that there are 8 divided dock signals 1x_CLK_P0 to 1x_CLK_P7, each of which has the same frequency as the reference clock signal CLK. However, the scope or spirit of the disclosed technology is not limited thereto, and it should be noted that the number of clock frequencies and the number of divided clock signals may also be changed as necessary.

Figure 6:
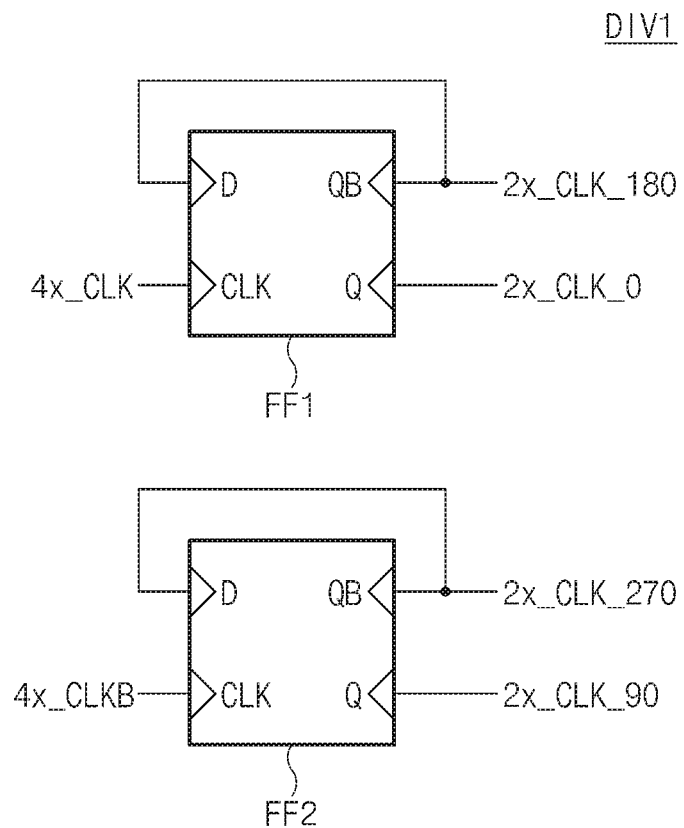
FIG. 6 is a schematic diagram illustrating a clock divider shown in FIG. 5 in accordance with an embodiment of the disclosed technology.

FIG. 6 is a schematic diagram illustrating the clock divider DIV1 shown in FIG. 5.

Referring to FIG. 6, the clock divider DIV1 may allow the divided clock signals 2x_CLK_P0, 2x_CLK_P1, 2x_CLK_P2, and 2x_CLK_P3 to respectively generate divided clock signals 2x_CLK_0 (having a phase difference of 0°), 2x_CLK_90 (having a phase difference of 90°), 2x_CLK_180 (having a phase difference of 180°), and 2x_CLK_270 (having a phase difference of 270°).

That is, the clock divider DIV1 may generate divided clock signals 2x_CLK_0, 2x_CLK_180, and 2x_CLK_270 having a predetermined phase interval therebetween. For example, the clock divider DIV may divide 360 degrees into 4 phases such that 4 divided clock signals 2x_CLK_0, 2x_CLK_90, 2x_CLK_180, and 2x_CLK_270 having a predetermined phase interval (i.e., a phase interval of 90 degrees) therebetween.

The clock divider DIV1 may include a plurality of flip-flops FF1 and FF2. Although the plurality of flip-flops FF1 and FF2 in accordance with the embodiment can be implemented as D flip-flops for convenience of description, the scope or spirit of the disclosed technology is not limited thereto.

In this case, the flip-flop FF1 may be synchronized with the input clock signal 4x_CLK, and may thus generate divided clock signals 2x_CLK_0 and 2x_CLK_180 that are opposite in phase to each other. The flip-flop FF2 may be synchronized with the input clock signal 4x_CLKB, and may thus generate divided clock signals 2x_CLK_90 and 2x_CLK_270 that are opposite in phase to each other. That is, the flip-flop FF2 may allow the phase of each of the divided clock signals 2x_CLK_0 and 2x_CLK_180 to be shifted by 90° using the input clock signal 4x_CLKB that is opposite in phase to the other input clock signals 4x_CLK, and may thus generate the divided clock signals 2x_CLK_90 and 2x_CLK_270.

Figure 7:
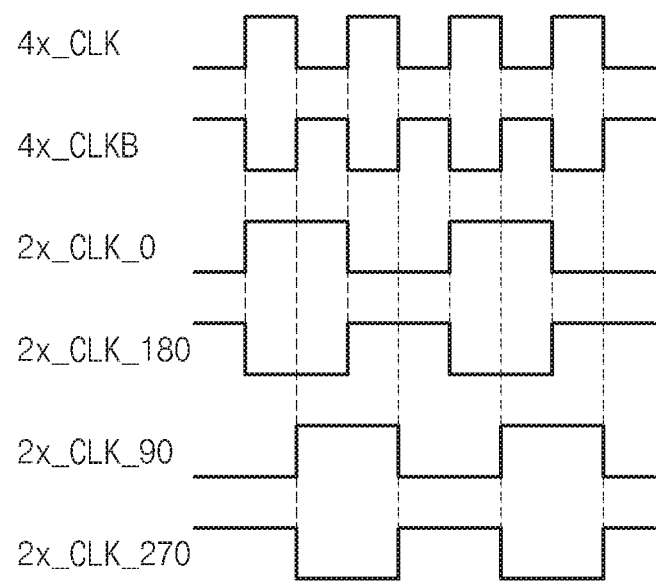
FIG. 7 is a clock waveform diagram illustrating a clock divider shown in FIG. 6 in accordance with an embodiment of the disclosed technology.

FIG. 7 is a clock waveform diagram illustrating the clock divider DIV1 shown in FIG. 6.

Referring to FIG. 7, the input clock signals 4x_CLK and 4x_CLKB applied to the clock divider DIV1 may be opposite in phase to each other. The divided clock signal 2x_CLK_0 generated from the flip-flop FF1 may be acquired by dividing the input clock signal 4x_CLK by two times. The divided clock signal 2x_CLK_180 may be opposite in phase to the divided clock signal 2x_CLK_0.

In addition, the divided clock signal 2x_CLK_90 generated from the flip-flop FF2 may be acquired by dividing the input clock signal 4x_CLKB by two times. The divided clock signal 2x_CLK_270 may be opposite in phase to the divided dock signal 2x_CLK_90.

FIG. 8 is a schematic diagram illustrating the clock divider DIV2 shown in FIG. 5.

Referring to FIG. 8, the clock divider DIV2 may generate the divided clock signals 1x_CLK_0, 1x_CLK_90, 1x_CLK_180, and 1x_CLK_270 having a predetermined phase interval therebetween. The clock divider DIV1 may allow the divided clock signals 1x_CLK_P0, 1x_CLK_P2, 1x_CLK_P4, and 1x_CLK_P6 to respectively generate divided dock signals 1x_CLK_0 (having a phase difference of 0°), 1x_CLK_90 (having a phase difference of 90°), 1x_CLK_180 (having a phase difference of 180°), and 1x_CLK_270 (having a phase difference of 270°). That is, the clock divider DIV2 may divide 360 degrees into 4 phases such that 4 divided clock signals 1x_CLK_0, 1x_CLK_90, 1x_CLK_180, and 1x_CLK_270 have a predetermined phase interval (i.e., a phase interval of 90 degrees) therebetween.

The clock divider DIV2 may include a plurality of flip-flops FF3 and FF4. Although the plurality of flip-flops FF3 and FF4 in accordance with the embodiment can be implemented as D flip-flops for convenience of description, the scope or spirit of the disclosed technology is not limited thereto.

In this case, the flip-flop FF3 may be synchronized with the input clock signal 2x_CLK_P0, and may thus generate divided clock signals 1x_CLK_0 and 1x_CLK_180 that are opposite in phase to each other. The flip-flop FF4 may be synchronized with the input clock signal 2x_CLK_P2, and may thus generate divided clock signals 1x_CLK_90 and 1x_CLK_270 that are opposite in phase to each other.

FIG. 9 is a schematic diagram illustrating the clock divider DIV3 shown in FIG. 5.

Referring to FIG. 9, the clock divider DIV3 may generate the divided clock signals 1x_CLK_45, 1x_CLK_135, 1x_CLK_225 and 1x_CLK_315 having a predetermined phase interval therebetween. The clock divider DIV3 may allow the divided clock signals 1x_CLK_P1, 1x_CLK_P3, 1x_CLK_P5, and 1x_CLK_P7 to respectively generate divided clock signals 1x_CLK_45 (having a phase difference of 45°), 1x_CLK_135 (having a phase difference of 135°), 1x_CLK_225 (having a phase difference of 225°), and 1x_CLK_315 (having a phase difference of 315°). That is, the clock divider DIV3 may divide 360 degrees into 4 phases such that 4 divided clock signals 1x_CLK_45, 1x_CLK_135, 1x_CLK_225, and 1x_CLK_315 have a predetermined phase interval (i.e., a phase interval of 90 degrees) therebetween.

The clock divider DIV3 may include a plurality of flip-flops FF5 and FF6. Although the plurality of flip-flops FF5 and FF6 in accordance with the embodiment can be implemented as D flip-flops for convenience of description, the scope or spirit of the disclosed technology is not limited thereto.

In this case, the flip-flop FF5 may be synchronized with the input clock signal 2x_CLK_P1, and may thus generate divided clock signals 1x_CLK_45 and 1x_CLK_225 that are opposite in phase to each other. The flip-flop FF6 may be synchronized with the input clock signal 2x_CLK_P3, and may thus generate divided clock signals 1x_CLK_135 and 1x_CLK_315 that are opposite in phase to each other.

Figure 10:
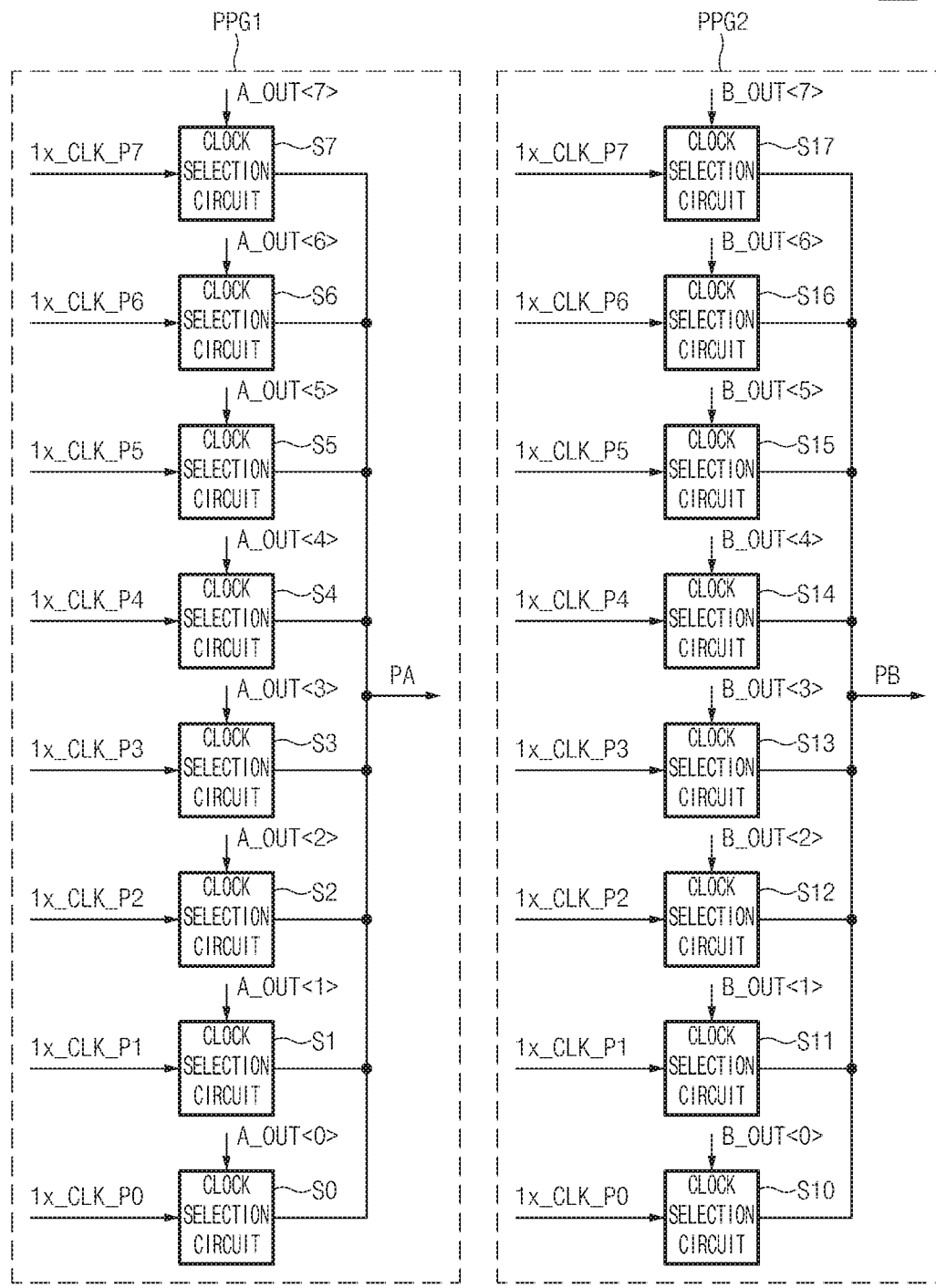
FIG. 10 is a detailed circuit diagram illustrating a precharge pulse generator shown in FIG. 4 in accordance with an embodiment of the disclosed technology.

FIG. 10 is a detailed circuit diagram illustrating the precharge pulse generator 532 shown in FIG. 4.

Referring to FIG. 10, the precharge pulse generator 532 may include a first precharge pulse generator PPG1 and a second precharge pulse generator PPG2.

In this case, the first precharge pulse generator PPG1 may generate the pulse signal PA in response to one decoding signal selected from among the decoding signals A_OUT<7:0> of a first group. The first precharge pulse generator PPG1 may select any one of the divided clock signals 1x_CLK_P- to CLK_P7, and may thus generate the pulse signal PA.

For example, the first precharge pulse generator PPG1 may select any one of the eight divided clock signals 1x_CLK_P0 to 1x_CLK_P7 having a phase interval of 45° therebetween. The first precharge pulse generator PPG1 may include a plurality of clock selection circuits S0 to S7.

For example, the clock selection circuit S0 may output the pulse signal PA in response to the decoding signal A_OUT<0>. The clock selection circuit S0 may select one divided clock signal 1x_CLK_P0 from among the plurality of divided clock signals 1x_CLK_P0 to 1x_CLK_P7, and may output the selected divided clock signal as the pulse signal PA.

The clock selection circuit S1 may output the pulse signal PA in response to the decoding signal A_OUT<1>. The clock selection circuit S1 may select one divided clock signal 1x_CLK_P1 from among the plurality of divided clock signals 1x_CLK_P0 to 1x_CLK_P7, and may output the selected divided clock signal as the pulse signal PA.

The clock selection circuit S2 may output the pulse signal PA in response to the decoding signal A_OUT<2>. The clock selection circuit S2 may select one divided clock signal 1x_CLK_P2 from among the plurality of divided clock signals 1x_CLK_P0 to 1x_CLK_P7, and may output the selected divided clock signal as the pulse signal PA.

The clock selection circuit S3 may output the pulse signal PA in response to the decoding signal A_OUT<3>. The clock selection circuit S3 may select one divided clock signal 1x_CLK_P3 from among the plurality of divided clock signals 1x_CLK_P0 to 1x_CLK_P7, and may output the selected divided clock signal as the pulse signal PA.

The clock selection circuit S4 may output the pulse signal PA in response to the decoding signal A_OUT<4>. The clock selection circuit S4 may select one divided clock signal 1x_CLK_P4 from among the plurality of divided clock signals 1x_CLK_P0 to 1x_CLK_P7, and may output the selected divided clock signal as the pulse signal PA.

The clock selection circuit S5 may output the pulse signal PA in response to the decoding signal A_OUT<5>. The clock selection circuit S5 may select one divided clock signal 1x_CLK_P5 from among the plurality of divided clock signals 1x_CLK_P0 to 1x_CLK_P7, and may output the selected divided clock signal as the pulse signal PA.

The clock selection circuit S6 may output the pulse signal PA in response to the decoding signal A_OUT<6>. The clock selection circuit S6 may select one divided clock signal 1x_CLK_P6 from among the plurality of divided clock signals 1x_CLK_P0 to 1x_CLK_P7, and may output the selected divided clock signal as the pulse signal PA.

The clock selection circuit S7 may output the pulse signal PA in response to the decoding signal A_OUT<7>. The clock selection circuit S7 may select one divided clock signal 1x_CLK_P7 from among the plurality of divided clock signals 1x_CLK_P0 to 1x_CLK_P7, and may output the selected divided clock signal as the pulse signal PA.

In the meantime, the second precharge pulse generator PPG2 may generate the pulse signal PB in response to one decoding signal selected from among the decoding signals B_OUT<7:0> of a second group. The second precharge pulse generator PPG2 may generate the pulse signal PB by selecting one decoding signal selected from among the plurality of divided clock signals 1x_CLK_P0 to 1x_CLK_P7. For example, the second precharge pulse generator PPG2 may select one divided clock signal from among the eight divided clock signals 1x_CLK_P0 to 1x_CLK_P7 having a phase interval of 45° therebetween. The second precharge pulse generator PPG2/ may include a plurality of clock selection circuits 510 to S17.

For example, the clock selection circuit 510 may output the pulse signal PB in response to the decoding signal B_OUT<0>. The clock selection circuit 510 may select one divided clock signal 1x_CLK_P0 from among the plurality of divided clock signals 1x_CLK_P0 to 1x_CLK_P7, and may output the selected divided clock signal as the pulse signal PB.

The clock selection circuit 511 may output the pulse signal PB in response to the decoding signal B_OUT<1>. The clock selection circuit 511 may select one divided clock signal 1x_CLK_P1 from among the plurality of divided clock signals 1x_CLK_P0 to 1x_CLK_P7, and may output the selected divided clock signal as the pulse signal PB.

The clock selection circuit S12 may output the pulse signal PB in response to the decoding signal B_OUT<2>. The clock selection circuit S12 may select one divided clock signal 1x_CLK_P2 from among the plurality of divided clock signals 1x_CLK_P0 to 1x_CLK_P7, and may output the selected divided clock signal as the pulse signal PB.

The clock selection circuit S13 may output the pulse signal PB in response to the decoding signal B_OUT<3>. The clock selection circuit S13 may select one divided clock signal 1x_CLK_P3 from among the plurality of divided clock signals 1x_CLK_P0 to 1x_CLK_P7, and may output the selected divided clock signal as the pulse signal PB.

The clock selection circuit S14 may output the pulse signal PB in response to the decoding signal B_OUT<4>. The clock selection circuit S14 may select one divided clock signal 1x_CLK_P4 from among the plurality of divided clock signals 1x_CLK_P0 to 1x_CLK_P7, and may output the selected divided clock signal as the pulse signal PB.

The clock selection circuit S15 may output the pulse signal PB in response to the decoding signal B_OUT<5>. The clock selection circuit S15 may select one divided clock signal 1x_CLK_P5 from among the plurality of divided clock signals 1x_CLK_P0 to 1x_CLK_P7, and may output the selected divided clock signal as the pulse signal PB.

The clock selection circuit S16 may output the pulse signal PB in response to the decoding signal B_OUT<6>. The dock selection circuit S16 may select one divided clock signal 1x_CLK_P6 from among the plurality of divided dock signals 1x_CLK_P0 to 1x_CLK_P7, and may output the selected divided clock signal as the pulse signal PB.

The clock selection circuit S17 may output the pulse signal PB in response to the decoding signal B_OUT<7>. The clock selection circuit S17 may select one divided clock signal 1x_CLK_P7 from among the plurality of divided clock signals 1x_CLK_P0 to 1x_CLK_P7, and may output the selected divided clock signal as the pulse signal PB.

As described above, the first and second precharge pulse generators PPG1 and PPG2 may receive the plurality of divided clock signals 1x_CLK_P0 to 1x_CLK_P7 divided by the clock dividers DIV1 to DIV3. The first and second precharge pulse generators PPG1 and PPG2 may select one or more among the divided clock signals 1x_CLK_P0 to 1x_CLK_P7 according to the decoding signals A_OUT<7:0> of the first group and the decoding signals B_OUT<7:0> of the second group, decoding signals A_OUT<7:0> and B_OUT<7:0> correspond to the precharge pulse-width control signal PSEL representing the PVT (Process, Voltage, Temperature) conditions.

Accordingly, the embodiment of the disclosed technology may select and combine one or more among the plurality of divided clock signals 1x_CLK_P0 to 1x_CLK_P7 in different ways according to the PVT conditions, and may thus generate the pulse signals PA and PB, such that the precharge signal PCG having a predetermined pulse width may be generated irrespective of PVT changes.

Figure 11:
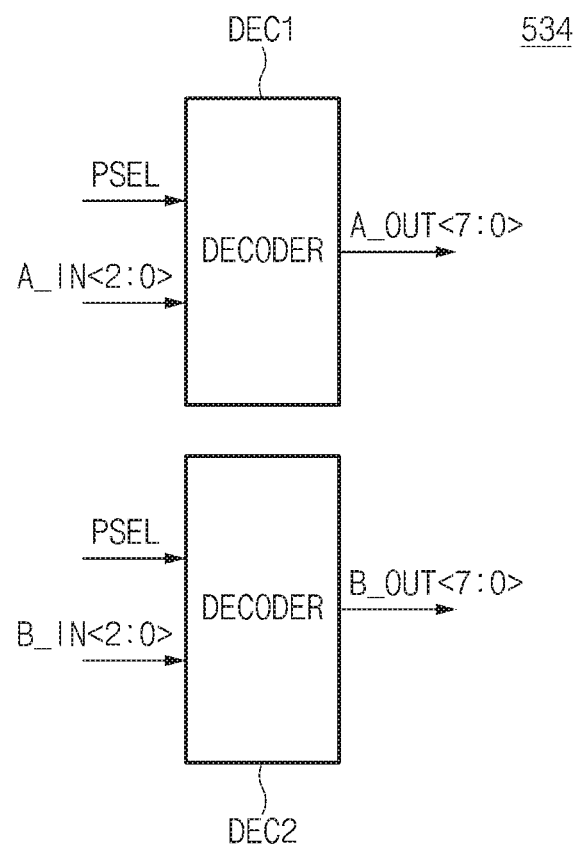
FIG. 11 is a detailed circuit diagram illustrating a decoding circuit shown in FIG. 4 in accordance with an embodiment of the disclosed technology.

FIG. 11 is a detailed circuit diagram illustrating the decoding circuit 534 shown in FIG. 4.

Referring to FIG. 11, the decoding circuit 534 may include a plurality of decoders DEC1 and DEC2.

In this case, the decoder DEC1 may decode the selection control signals A_IN<2:0> of the first group in response to the precharge pulse-width control signal PSEL, and may thus output the decoding signals A_OUT<7:0> of the first group to the first precharge pulse generator PPG1. In this case, the decoder DEC1 may activate only one of the decoding signals A_OUT<7:0> of the first group.

The decoder DEC2 may decode the selection control signals B_IN<2:0> of the second group in response to the precharge pulse-width control signal PSEL, and may thus output the decoding signals B_OUT<7:0> of the second group to the second precharge pulse generator PPG2. In this case, the decoder DEC2 may activate only one of the decoding signals B_OUT<7:0>.

Although the embodiment of the disclosed technology has exemplarily disclosed that each of the decoders DEC1 and DEC2 generates 8 output signals by decoding three input signals for convenience of description, the scope or spirit of the disclosed technology is not limited thereto, and it should be noted that the number of input/output (I/O) signals of the decoders DEC1 and DEC2 may also be changed as necessary.

Figure 12:
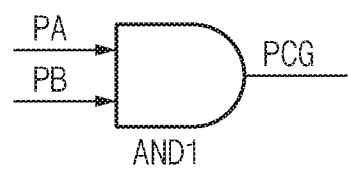
FIG. 12 is a detailed circuit diagram illustrating a precharge signal generator shown in FIG. 4 in accordance with an embodiment of the disclosed technology.

FIG. 12 is a detailed circuit diagram illustrating the precharge signal generator 535 shown in FIG. 4.

Referring to FIG. 12, the precharge signal generator 535 may generate the precharge signal PCG by combining the pulse signals PA and PB. The precharge signal generator 535 may include an AND gate AND1 that generates the precharge signal PCG by performing a logic AND operation between the pulse signals PA and PB. For example, the precharge signal generator 535 may output the enabled precharge signal PCG when each of the pulse signals PA and PB is activated at a logic high level.

The phase of the precharge signal PCG generated from the precharge signal generator 535 may be established as shown in the following Table 1.

signal PB may be inverted, such that the pulse signals PA and PB having a phase difference of 180° therebetween may not be combined with each other.

The phase values shown in Table 1 have been disclosed only for illustrative purposes of the embodiment of the disclosed technology, and the scope or spirit of the phases of the precharge signal PCG is not limited thereto.

Figure 13:
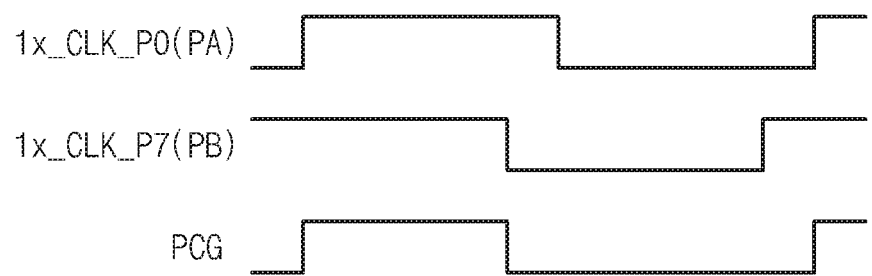
FIG. 13 is a waveform diagram illustrating a precharge signal generator shown in FIG. 12 in accordance with an embodiment of the disclosed technology.

FIG. 13 is a waveform diagram illustrating the precharge signal generator 535 shown in FIG. 12.

Referring to FIG. 13, the pulse signal PA is generated by the divided clock signal 1x_CLK_P0 of the first precharge pulse generator PPG1 for convenience of description. The pulse signal PB is generated by the divided clock signal 1x_CLK_P7 of the second precharge pulse generator PPG2. As a result, the precharge signal generator 535 may output the precharge signal PCG at a logic high level during a predetermined section in which the pulse signals PA and PB are activated at a logic high level.

As described above, the pulse width of the precharge signal PCG may be adjusted in various ways according to a combination of the pulse signals PA and PB, each of which has various phases.

Figure 14:
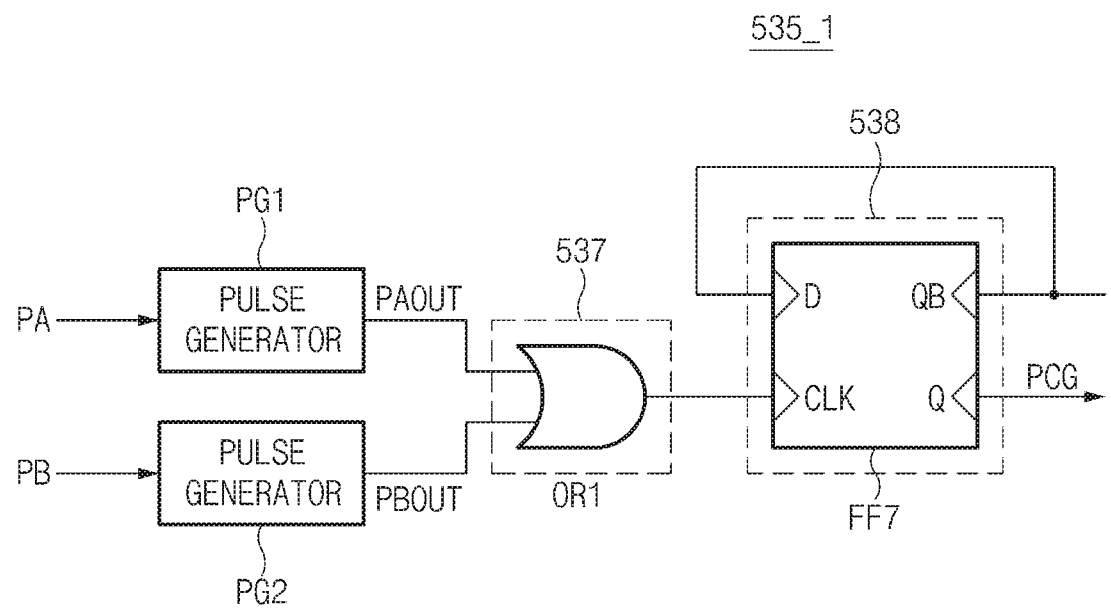
FIG. 14 is a detailed circuit diagram illustrating a precharge signal generator shown in FIG. 4 in accordance with another embodiment of the disclosed technology.

FIG. 14 is a detailed circuit diagram illustrating the precharge signal generator 535 shown in FIG. 4.

Referring to FIG. 14, the precharge signal generator 535-1 may include pulse generators PG1 and PG2, a combination circuit 537, and a precharge signal output circuit 538.

In this case, the pulse generator PG1 may generate a precharge pulse signal PAOUT in response to the pulse signal PA. The pulse generator PG2 may generate a precharge pulse signal PBOUT in response to the pulse signal PB.

The combination circuit 537 may include an OR gate OR1 that performs a logic OR operation between the precharge pulse signal PAOUT and the precharge pulse signal PBOUT. That is, the combination circuit 537 may output a high-level signal when at least one of the precharge pulse signal PAOUT and the precharge pulse signal PBOUT is activated.

In addition, the precharge signal output circuit 538 may output the precharge signal PCG by synchronizing with the output signal of the combination circuit 537. The precharge signal output circuit 538 may include a flip-flop FF7. The flip-flop FF7 may generate the precharge signal PCG upon

TABLE 1

| | | Pulse Signal (PA) | | | | | | | |
|---|---|---|---|---|---|---|---|---|---|
| | | 0 | 45 | 90 | 135 | 180 | 225 | 270 | 315 |
| Pulse Signal (PB) | 0 | 0~180 | 45~180 | 90~180 | 135~180 | — | 0~45 | 0~90 | 0~135 |
| | 45 | 45~180 | 45~225 | 90~225 | 135~225 | 180~225 | — | 45~90 | 45~135 |
| | 90 | 90~180 | 90~225 | 90~270 | 135~270 | 180~270 | 225~270 | — | 90~135 |
| | 135 | 135~180 | 135~225 | 135~270 | 135~315 | 180~315 | 225~315 | 270~315 | — |
| | 180 | — | 180~225 | 180~270 | 180~315 | 180~0 | 225~0 | 270~0 | 315~0 |
| | 225 | 0~45 | — | 225~270 | 225~315 | 225~0 | 225~45 | 270~45 | 315~45 |
| | 270 | 0~90 | 45~90 | — | 270~315 | 270~0 | 270~45 | 270~90 | 315~90 |
| | 315 | 0~135 | 45~135 | 90~135 | — | 315~0 | 315~45 | 315~90 | 315~135 |

For example, as shown in Table 1, the pulse signal PA may include 8 signals that respectively correspond to 0°, 45°, 90°, 135°, 180°, 225°, 270°, and 315°. The pulse signal PB may include 8 signals that respectively correspond to 0°, 45°, 90°, 135°, 180°, 225°, 270°, and 315°.

The precharge signal generator 535 may generate the precharge signal PCG by combining the pulse signals PA and PB having various phases. However, when a phase difference between the pulse signal PA and the other pulse signal PB is 180°, phases of the pulse signal PA and the pulse receiving the output signal of the combination circuit 537 as a clock signal CLK. Although the flip-flop FF7 can be implemented as a D flip-flop for convenience of description, the scope of the flip-flop is not limited thereto.

For example, the precharge signal generator 535_1 may recognize the rising section of each pulse signal PA or PB, and may thus change a value of the flip-flop FF7 based on the recognized rising section. That is, the precharge signal PCG may be activated in the rising edge of the pulse signal PA. In contrast, the precharge signal PCG may be deactivated in the rising edge of the pulse signal PB.

The phase of the precharge signal PCG generated by the precharge signal generator 535_1 may be established as shown in the following Table 2.

TABLE 2

| | | \multicolumn{8}{c}{Pulse Signal (PA)} | | | | | | | |
|---|---|---|---|---|---|---|---|---|
| | | 0 | 45 | 90 | 135 | 180 | 225 | 270 | 315 |
| Pulse | 0 | — | 45~0 | 90~0 | 135~0 | 180~0 | 225~0 | 270~0 | 315~0 |
| Signal | 45 | 0~45 | — | 90~45 | 135~45 | 180~45 | 225~45 | 270~45 | 315~45 |
| (PB) | 90 | 0~90 | 45~90 | — | 135~90 | 180~90 | 22590 | 270~90 | 315~90 |
| | 135 | 0~135 | 45~135 | 90~135 | — | 180~135 | 225~135 | 270~135 | 315~135 |
| | 180 | 0~180 | 45~180 | 90~180 | 135~180 | — | 225~180 | 270~180 | 315~180 |
| | 225 | 0~225 | 45~225 | 90~225 | 135~225 | 180~225 | — | 270~225 | 315~225 |
| | 270 | 0~270 | 45~270 | 90~270 | 135~270 | 180~270 | 225~270 | — | 315~270 |
| | 315 | 0~315 | 45~315 | 90~315 | 135~315 | 180~315 | 225~315 | 270~315 | — |

For example, as shown in Table 2, the pulse signal PA may include 8 signals that respectively correspond to 0°, 45°, 90°, 135°, 180°, 225°, 270°, and 315°. The pulse signal PB may include 8 signals that respectively correspond to 0°, 45°, 90°, 135°, 180°, 225°, 270°, and 315°.

The precharge signal generator 535_1 may generate the precharge signal PCG by combining the pulse signals PA and PB having various phases. However, the pulse signals PA and PB having the same phases may not be combined with each other.

The phase values shown in Table 2 have been disclosed only for illustrative purposes of the embodiment of the disclosed technology, and the scope or spirit of the phases of the precharge signal PCG is not limited thereto.

Figure 15:
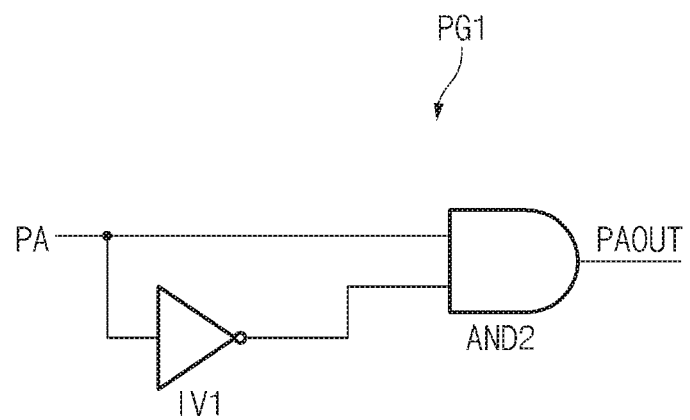
FIG. 15 is a detailed circuit diagram illustrating a pulse generator shown in FIG. 14 in accordance with another embodiment of the disclosed technology.

FIG. 15 is a detailed circuit diagram illustrating each of the pulse generators PG1 and PG2 shown in FIG. 14. The detailed circuit diagrams of the pulse generators PG1 and PG2 are identical in structure to each other, such that only one pulse generator PG1 will hereinafter be described with reference to FIG. 15 for convenience of description.

The pulse generator PG1 may include an inverter IV1 and an AND gate AND2. In this case, the AND gate AND2 may generate the precharge pulse signal PAOUT by performing a logic AND operation between the pulse signal PA and the other pulse signal PA inverted by the inverter IV1.

As is apparent from the above description, the image sensor in accordance with the embodiments of the disclosed technology may stably perform a precharge operation irrespective of a PVT (Process, Voltage, Temperature) condition.

Those skilled in the art will appreciate that the disclosed technology may be carried out in other specific ways than those set forth herein without departing from the spirit and essential characteristics of the disclosed technology. The above embodiments are therefore to be construed in all aspects as illustrative and not restrictive. The scope of the disclosed technology should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosed technology or included as a new claim by a subsequent amendment after the application is filed.

Although a number of illustrative embodiments consistent with the disclosed technology have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensor comprising:
   a divider configured to generate a plurality of divided clock signals by dividing one or more input clock signals;
   a precharge pulse generator configured to generate a first pulse signal by selecting any one of the plurality of divided clock signals in response to decoding signals of a first group, and generate a second pulse signal by selecting any one of the plurality of divided clock signals in response to decoding signals of a second group; and
   a precharge signal generator configured to generate a precharge signal by combining the first pulse signal and the second pulse signal.

2. The image sensor according to claim 1, wherein the input clock signal has a higher frequency than that of a reference clock signal.

3. The image sensor according to claim 1, further comprising a precharge pulse-width control signal generator configured to generate a precharge pulse-width control signal for selecting any one of the decoding signals of the first group and selecting any one of the decoding signals of the second group.

4. The image sensor according to claim 3, further comprising a decoding circuit configured to activate any one of the decoding signals of the first group in response to the precharge pulse-width control signal, and activate any one of the decoding signals of the second group in response to the precharge pulse-width control signal.

5. The image sensor according to claim 3, wherein the precharge pulse-width control signal generator is configured to control a precharge pulse-width control signal in response to process, voltage, and temperature (PVT) conditions.

6. The image sensor according to claim 1, wherein the divider includes:
   a first clock divider configured to divide N number of the input clock signals, and generate 2N number of divided clock signals having a predetermined first phase interval therebetween; and a second clock divider configured to divide the 2N number of divided clock signals, and generate 4N divided clock signals having a predetermined second phase interval therebetween.

7. The image sensor according to claim 6, wherein the N number of the input clock signals are opposite in phase to each other.

8. The image sensor according to claim 1, wherein the precharge pulse generator includes:
   a first precharge pulse generator configured to generate the first pulse signal by selecting any one of the plurality of divided clock signals in response to the decoding signals of the first group; and
   a second precharge pulse generator configured to generate the second pulse signal by selecting any one of the plurality of divided clock signals in response to the decoding signals of the second group.

9. The image sensor according to claim 8, wherein the first precharge pulse generator includes a plurality of clock selection circuits configured to select any one of the plurality of divided clock signals in response to the decoding signals of the first group, and output the selected divided clock signal as a first pulse signal.

10. The image sensor according to claim 8, wherein the second precharge pulse generator includes a plurality of clock selection circuits configured to select any one of the plurality of divided clock signals in response to the decoding signals of the first group, and output the selected divided clock signal as a second pulse signal.

11. The image sensor according to claim 1, wherein the precharge signal generator is configured to enable the precharge signal when each of the first pulse signal and the second pulse signal is activated at a logic high level.

12. The image sensor according to claim 1, wherein the precharge signal generator is configured to activate the precharge signal at a rising edge of the first pulse signal, and deactivate the precharge signal at a rising edge of the second pulse signal.

13. The image sensor according to claim 1, wherein the precharge signal generator includes:
   a first pulse generator configured to generate a first precharge pulse signal in response to the first pulse signal;
   a second pulse generator configured to generate a second precharge pulse signal in response to the second pulse signal;
   a combination circuit configured to combine the first precharge pulse signal and the second precharge pulse signal; and
   a precharge signal output circuit configured to output the precharge signal by synchronizing with an output clock signal of the combination circuit.

14. The image sensor according to claim 13, wherein the combination circuit is configured to output a high-level signal when at least one of the first precharge pulse signal and the second precharge pulse signal is activated.

15. An image sensor comprising:
   a line memory configured to latch a digital signal corresponding to a pixel signal, and output the latched digital signal to a pair of bit lines in response to an output control signal;
   a sense amplifier configured to amplify a voltage of the pair of bit lines in response to a sensing enable signal;
   a precharge circuit configured to precharge the pair of bit lines in response to a precharge signal; and
   a precharge controller configured to generate a plurality of divided clock signals by dividing an input clock signal, generate a first pulse signal and a second pulse signal in response to a divided clock signal selected from among the plurality of divided clock signals according to decoding signals, and generate the precharge signal by combining the first pulse signal and the second pulse signal.

16. The image sensor according to claim 15, wherein the precharge controller includes:
   a divider configured to generate the plurality of divided clock signals by dividing the input clock signal;
   a precharge pulse generator configured to generate the first pulse signal by selecting any one of the plurality of divided clock signals in response to decoding signals of a first group, and generate the second pulse signal by selecting any one of the plurality of divided clock signals in response to decoding signals of a second group; and
   a precharge signal generator configured to generate the precharge signal by combining the first pulse signal and the second pulse signal.

17. The image sensor according to claim 16, further comprising:
   a precharge pulse-width control signal generator configured to generate a precharge pulse-width control signal controlling a pulse width of the precharge signal; and
   a decoding circuit configured to activate any one of the decoding signals of the first group in response to the precharge pulse-width control signal, and activate any one of the decoding signals of the second group in response to the precharge pulse-width control signal.

18. The image sensor according to claim 16, wherein the plurality of divided clock signals is spaced apart from each other at intervals of a predetermined phase.

19. The image sensor according to claim 16, wherein each of the first precharge pulse generator and the second precharge pulse generator includes a plurality of clock selection circuits configured to select any one of the plurality of divided clock signals in response to the decoding signals, and output the selected divided clock signal as a pulse signal.

20. The image sensor according to claim 16, wherein the precharge signal generator is configured to enable the precharge signal when each of the first pulse signal and the second pulse signal is activated at a logic high level.

* * * * *